United States Patent
Greer, Jr. et al.

(10) Patent No.: US 7,817,428 B2
(45) Date of Patent: Oct. 19, 2010

(54) ENCLOSURE WITH INTEGRATED HEAT WICK

(76) Inventors: David Randall Greer, Jr., 615 White Oak Flat Rd., Charlotte, TN (US) 37036; Jeffrey J. Farago, 100 Oakland Hills Dr., Franklin, TN (US) 37069

( * ) Notice: Subject to any disclaimer, the term of this patent is extended or adjusted under 35 U.S.C. 154(b) by 75 days.

(21) Appl. No.: 12/163,271

(22) Filed: Jun. 27, 2008

(65) Prior Publication Data

US 2009/0321130 A1    Dec. 31, 2009

(51) Int. Cl.
*H05K 7/20* (2006.01)
(52) U.S. Cl. .................. 361/720; 361/704; 361/715; 257/706; 174/16.3
(58) Field of Classification Search .............. 361/690, 361/695, 700, 701, 704, 715, 719, 808
See application file for complete search history.

(56) References Cited

U.S. PATENT DOCUMENTS

| | | | | |
|---|---|---|---|---|
| 4,621,304 | A * | 11/1986 | Oogaki et al. | 361/720 |
| 5,012,386 | A * | 4/1991 | McShane et al. | 361/715 |
| 5,387,815 | A * | 2/1995 | Nishiguchi | 257/704 |
| 5,525,835 | A * | 6/1996 | Nishiguchi | 257/712 |
| 6,028,355 | A * | 2/2000 | Gates | 257/706 |
| 6,317,322 | B1 * | 11/2001 | Ueki et al. | 361/700 |
| 7,525,798 | B2 * | 4/2009 | Schultz et al. | 361/688 |
| 2005/0036292 | A1 * | 2/2005 | Chengalva et al. | 361/715 |
| 2006/0064709 | A1 * | 3/2006 | Throckmorton et al. | 720/649 |
| 2006/0114655 | A1 * | 6/2006 | Wallace | 361/704 |

FOREIGN PATENT DOCUMENTS

| | | |
|---|---|---|
| DE | 42 24 720 A1 | 2/1994 |
| EP | 0 522 563 A2 | 1/1993 |

OTHER PUBLICATIONS

PCT International Search Report for International Application No. PCT/US2009/047729 dated Sep. 16, 2009 (5 pages).
PCT International Written Opinion for International Application No. PCT/US2009/047729 dated Sep. 16, 2009 (6 pages).

* cited by examiner

*Primary Examiner*—Jayprakash N Gandhi
*Assistant Examiner*—Courtney Smith

(57) ABSTRACT

An electrical enclosure system for transferring heat from a closed environment, includes an electrical device having a heat-generating part, and a polymer-based ventless housing for protecting the electrical device from environmental contaminants. The ventless housing fully encloses the electrical device and includes a base layer forming an impact-resistant portion of the ventless housing. The base layer includes one or more open areas in close proximity to the heat-generating part. The ventless housing further includes an integrated thermally conductive layer that forms a heat-flow path for conducting heat away from the heat-generating part towards an exterior environment. The integrated thermally conductive layer is molded around the base layer such that portions of the integrated thermally conductive layer cover the open areas of the base layer.

15 Claims, 3 Drawing Sheets

ENCLOSURE WITH INTEGRATED HEAT WICK

FIELD OF THE INVENTION

This invention is directed generally to electrical systems, and, more particularly, to a ventless enclosure for dissipating heat from an electrical system.

BACKGROUND OF THE INVENTION

Electrical systems in residential, commercial, and industrial applications often include electrical equipment having at least one heat-generating component, e.g., an electrical generator or an electrical transformer. Often, for various reasons, the electrical equipment is located within an electrical enclosure, which serves numerous functions. For example, the electrical enclosure can reduce the likelihood of contact with high-voltage wiring (e.g., reduces risk of electrocution), can improve electrical performance in challenging (e.g., dirty or dusty) environments by reducing contact between contaminants and the electrical equipment, can protect the electrical equipment from physical damage, etc.

To adequately perform its functions, it is generally desired for the electrical enclosure to be a ventless (or non-vented) enclosure, e.g., an enclosure that does not have any vents or openings. The presence of vents can create many problems, such as increasing the risk of electrocution and decreasing electrical performance, e.g., by allowing ingress of liquids, humidity, dust, dirt, corrosives, etc. In fact, ventless enclosures are often required by environmental and/or governmental regulations in many electrical applications.

One problem associated with ventless enclosures is that heat can build-up inside the enclosure without having an efficient heat path for transfer outside the enclosure. The inherent lack of physical openings in the ventless enclosure effectively traps the generated heat inside the enclosure. The heat build-up can have adverse consequences for the electrical equipment located inside the ventless enclosure (e.g., can cause malfunctions, increase risk of fire hazards, etc.).

What is needed, therefore, is a ventless enclosure for an electrical system that addresses the above-stated and other problems.

SUMMARY OF THE INVENTION

In an implementation of the present invention, an electrical enclosure system with heat generating components is housed within a ventless enclosure that incorporates an enclosure (or housing). The ventless enclosure includes a support structure integrated with a heat-wicking or heat conducting matrix (possibly polymer based) that transfers heat out of the system while protecting the electrical system components from environmental contaminants. The ventless housing fully encloses the electrical device and includes a base layer (i.e., the support structure) forming an impact-resistant portion of the ventless housing. The base layer includes one or more open areas in close proximity to the heat-generating part. The ventless housing further includes an integrated thermally conductive layer (i.e., the heat-wicking matrix) that forms a heat-flow path for conducting heat away from the heat-generating part towards an exterior environment. The integrated thermally conductive layer is molded around the base layer such that portions of the integrated thermally conductive layer fill in the open areas of the base layer.

In an alternative implementation of the present invention, an electrical enclosure system includes an electrical device having a heat-generating component and a ventless housing. The ventless housing fully encloses the electrical device and the heat-generating component, and protects the heat-generating component from contaminants. The ventless housing includes an outer enclosure layer having a plurality of openings near the heat-generating component, and an internal enclosure layer having a higher thermal conductivity than the outer enclosure layer. The internal component is coupled to the outer enclosure layer and is positioned to cover the plurality of openings such that heat is conducted through the internal component from the heat-generating component to an exterior environment relative to the ventless housing.

In another alternative implementation of the present invention, an electrical enclosure system for efficient heat dissipation includes an electrical heat-generating device having at least one hot portion, the hot portion generating more heat than at least one other portion of the heat-generating device. The electrical system further includes a ventless housing for enclosing the electrical heat-generating device. The ventless housing includes a first layer forming a structural portion of the ventless housing, the first layer including at least one gap near the hot portion of the electrical heat-generating device. The ventless housing further includes a second layer forming a heat-flow path of the ventless housing, the second layer filling-in the gap of the first layer and being adapted to conduct more heat than the first layer from the hot portion to an environment exterior of the ventless housing.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

The invention may best be understood by reference to the following description taken in conjunction with the accompanying drawings, in which.

DETAILED DESCRIPTION OF THE ILLUSTRATED EMBODIMENTS

Although the invention will be described in connection with certain preferred embodiments, it will be understood that the invention is not limited to those particular embodiments. On the contrary, the invention is intended to include all alternatives, modifications and equivalent arrangements as may be included within the spirit and scope of the invention as defined by the appended claims.

Figure 1:
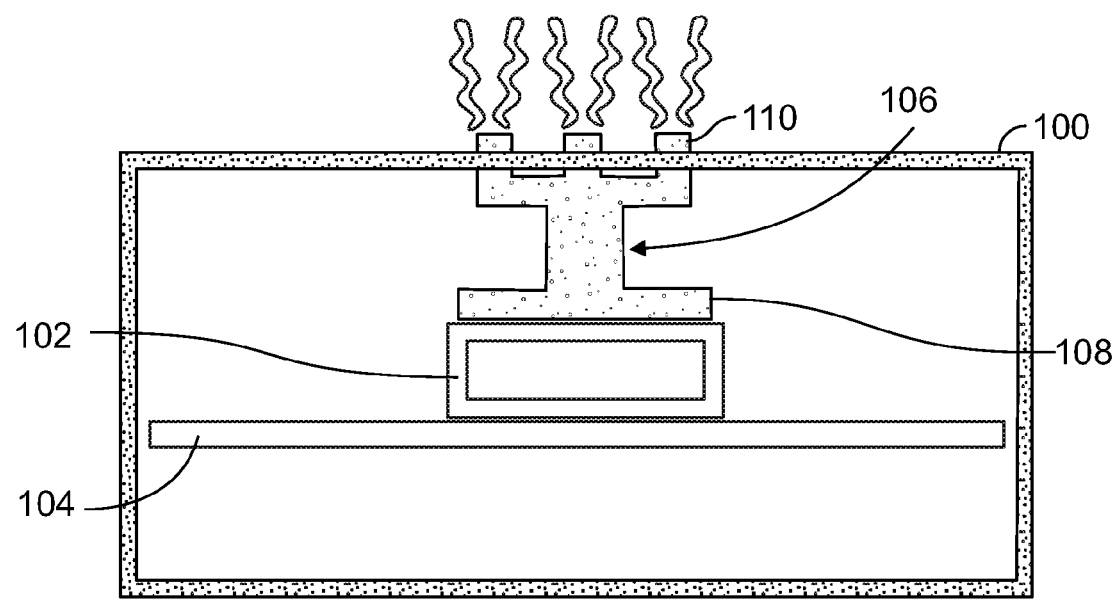
FIG. 1 is a cross-sectional side view illustration of a ventless electrical enclosure having an integrated heat wick, according to one embodiment.

Referring to FIG. 1, a ventless housing 100 encloses (fully or in part) an electrical heat-generating device 102, which may be optionally located on a supporting structure 104. The ventless housing 100 can efficiently dissipate heat build-up from inside the ventless housing 100 to an exterior environment by using a heat wick 106. The heat wick 106 has an internal member 108, located near the heat-generating device 102, and an external member 110.

The ventless housing 100 can be used in various electrical applications in which electrical equipment is required, such as a communication hub, an electric generator, an electric meter, an electric monitor, a transformer, etc. The shape of the ventless housing 100 can vary, for example, having a rectangular, circular, or other shapes. The method of fabrication for the ventless housing 100 can also vary, for example, including a molding method, a fabricated method, and an extruded method. The material of the ventless housing 100 can vary, for example, including a polymer material and a sheet metal material.

In general, one or more electrical heat-generating devices 102 (e.g., an electric generator) cause heat to build up inside the ventless housing 100. Because the ventless housing 100, by definition, lacks any physical vents or openings, the heat remains generally trapped inside the ventless housing 100, without having any adequate paths for being transferred outside the ventless housing 100. The heat build-up presents many problems, e.g., increasing the risk of fire hazard, decreasing longevity of any internal components (including the heat-generating device 102), and interfering with the proper functioning of the internal components.

As such, the heat wick 106 is provided to create a heat-flow path to transfer heat from inside the ventless housing 100 to an exterior environment. The heat wick 106 is designed to provide a higher thermal conductivity than the rest of the ventless housing 100. For example, the heat wick 106 can be made from a material that has a higher thermal conductivity than a base material of the ventless housing 100. The generated heat is channeled through the internal member 108 of the heat wick 106 and conducted outside the ventless housing 100, exiting through an external member 110 (e.g., a plurality of fins).

Figure 2:
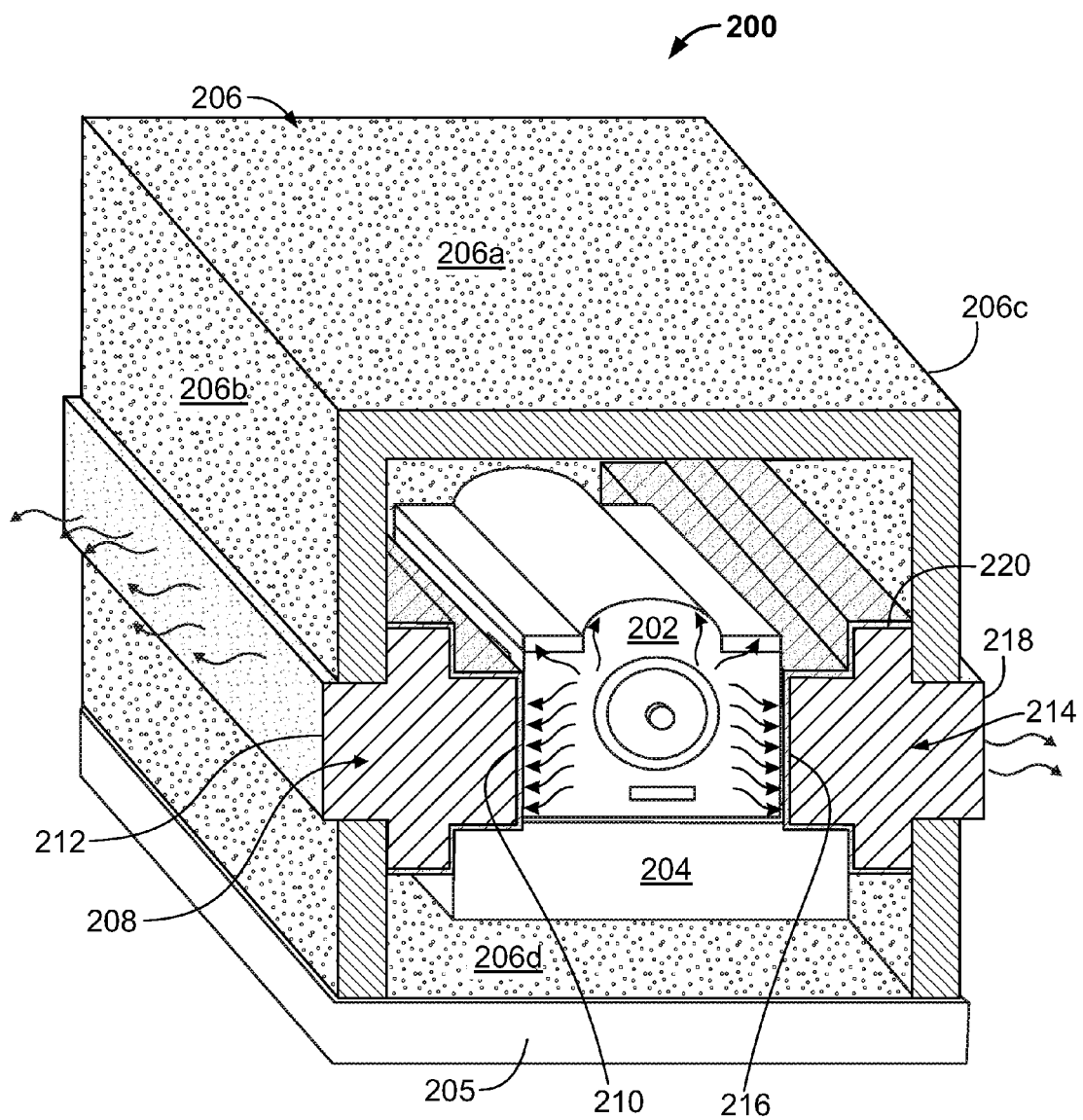
FIG. 2 is a cross-sectional perspective view illustration of a polymer-based ventless electrical enclosure having a molded thermally conductive layer, according to another embodiment.

Referring to FIG. 2, a ventless housing 200 encloses an electric generator 202 that is supported on a stand 204. The ventless housing 200 is positioned on a bottom structure 205. The ventless housing 200 includes a base layer 206 that forms an impact-resistant portion, a first integrated thermally conductive layer 208, and a second integrated thermally conductive layer 214, each of which forming a heat-flow path for conducting heat away from the electric generator 202. Optionally, the first conductive layer 208 and the second conductive layer 214 can be a single continuous conductive layer.

The base layer 206 includes a top surface 206a, a left side surface 206b, a right side surface 206c, and a bottom surface 206d. In alternative embodiments, only one of the bottom surface 206d or the bottom structure 205 is present. The base layer 206 is made from a polymer-based material and is the main material of the ventless housing 200. Additionally, each of the left side surface 206b and the right side surface 206c include a gap filled by the respective conductive layers 208, 214.

The first conductive layer 208 is molded around the base layer 206 through a process commonly referred to as "overmolding" or "insert molding," where one material is molded around the other while leaving desired portions of each exposed. Specifically, the conductive layer 208 is molded such that it fills in any open areas in the base layer 206. The second conductive layer 214 can be similar, if not identical, to the first conductive layer 208. The molding of the base layer 206 around the conductive layers 204, 214 results in a "watertight" union of the layers that provides an impact resistant enclosure with an integrated thermally conductive feature that serves as the heat flow path from the hot part (or parts) inside the enclosure to the external ambient air.

The first conductive layer 208 includes a first internal surface 210 and a first external surface 212. Similarly, the second conductive layer 214 includes a second internal surface 216 and a second external surface 218. Each of the first and second internal surfaces 210, 216 is in direct contact with the electric generator 202 to conduct generated heat away from the electric generator 202 towards the corresponding external surfaces 212, 218. Alternatively, the internal surfaces 210, 216 are not in direct contact with the electric generator 202. Instead they are separated by a gap, and are located in close proximity to the electric generator 202.

Optionally, in alternative embodiments, a heat transfer aid 220 can be used to further enhance the transfer of heat subsequently to the external ambient air. Some examples of heat transfer aids 220 include pastes, adhesives, etc.

Figure 3:
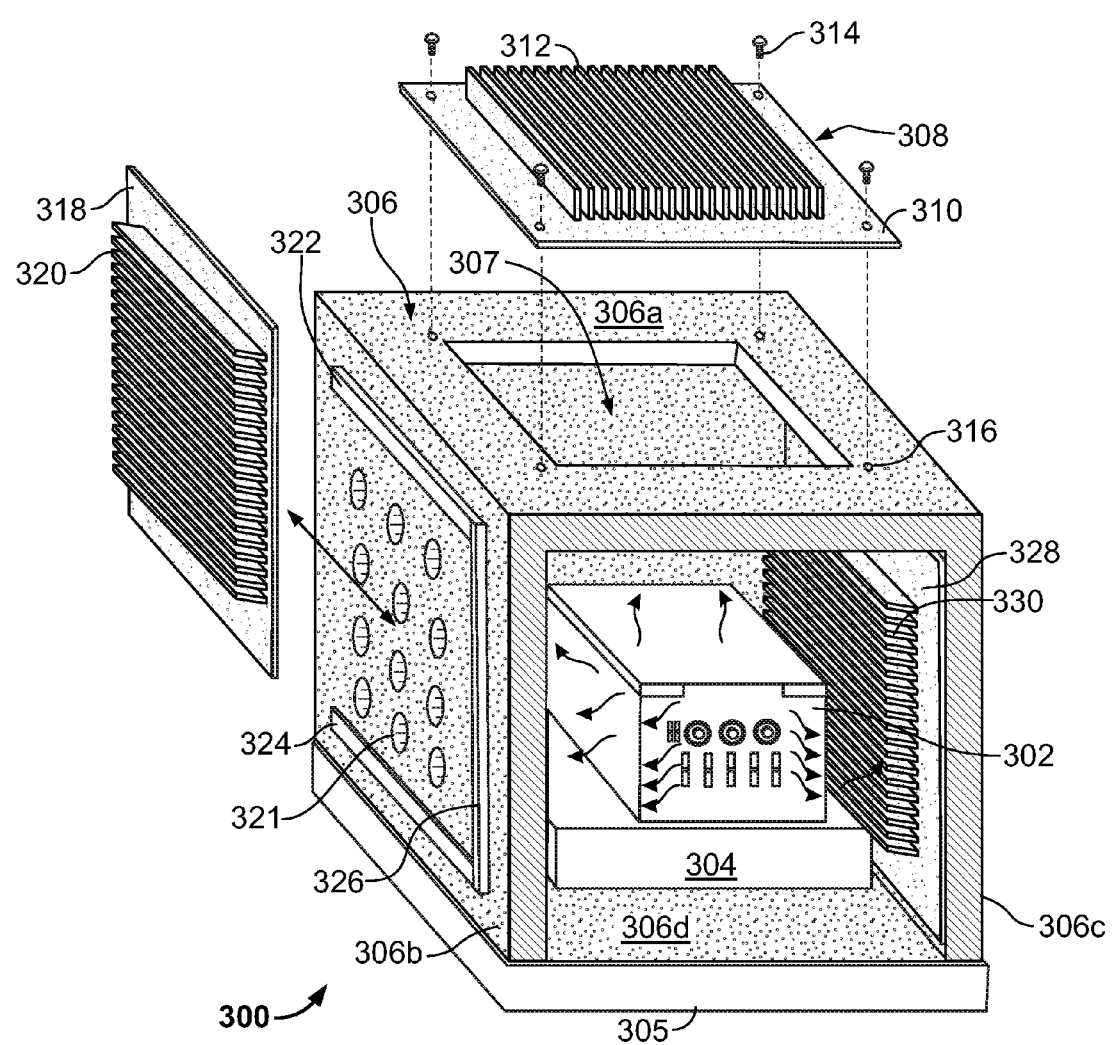
FIG. 3 is a cross-sectional perspective view illustration of a metal-based ventless electrical enclosure having a higher thermally conductive component, according to yet another embodiment.

Referring to FIG. 3, a ventless housing 300 encloses an electrical component 302, which is optionally supported by a stand 304. The ventless housing 300 is optionally positioned on a bottom structure 305. According to this embodiment, the ventless housing 300 includes a sheet metal-based outer enclosure 306 that has a top side 306a, a left side 306b, a right side 306c, and a bottom side 306d. The top side 306a has an opening 307 that is generally centrally located and rectangular in shape. Optionally, the opening 307 can be located anywhere and have any shape. The outer enclosure 306 can be fabricated, for example, by stamping, laser cutting, forming, welding, or piercing methods, or it can be extruded.

To create an efficient heat-flow path, the ventless housing 300 further includes localized heat dissipation components, which may be independently fabricated as internal or external "liners." For example, the localized heat dissipation components can be a top plate 308, a left plate 318, and a right plate 328. These localized heat dissipation components act to efficiently dissipate the trapped heat inside the ventless housing 300 by increasing surface area of the heat dissipation components. Any combination of such components can be used.

The top plate 308 includes a base plate 310, a plurality of external fins 312, and a plurality of screws 314 (which are generally inserted through corresponding screw holes). The top plate 308 is designed to have a higher thermal conductivity than the outer enclosure 306. In this example, the base plate 310 is much thinner than the top side 306a, and, additionally, the external fins 312 enhance the heat transfer through the top plate 308. The top plate 308 is positioned such that, when assembled, it covers the opening 307. Specifically, screws 314 are inserted through enclosure holes 316 to fix the top plate 308 externally to the top side 306a of the outer enclosure 306.

The left plate 318, having a plurality of external fins 320, is generally located (when assembled) on the left side 306b of the outer enclosure 306. The left plate 318 is external to the outer enclosure 306 and is designed to cover a plurality of holes 321 (which can form a particular perforation pattern) of the left side 306b. Any type of holes, slots, or perforation patterns can be used in addition to or instead of the holes 321 (or of the opening 307).

To fix the left plate 318 to the outer enclosure 306, the left plate 318 is inserted into receiving slots 322, 324 until it rests against a stop 326. Similar to the top plate 308, the left plate 318 can have, for example, a smaller thickness than the left side 306b, and can be made from a material that has a greater coefficient of thermal conductivity than the material of the outer enclosure 306. Alternatively, one or more of the left plate 318 and the top plate 308 can be fixed to the outer enclosure 306 as internal components.

The right plate 328 is attached internally to the outer enclosure 306, on the right side 306c. A plurality of fins 330, which are internally located, help to conduct heat generated by the electrical component 302 outside of the outer enclosure 306, to ambient air. The right plate 328 is integrated to the outer enclosure 306 using an adhesive. Alternatively, the right plate 328 can be fixed to the outer enclosure 306 as an external component.

According to alternative embodiments, any type of adhesives or fasteners can be used to provide integrated retention features for fixing any of the top plate 308, the left plate 318, or the right plate 328 to the outer enclosure 306. According to other alternative embodiments, any combination of fins and smooth surfaces can be included in any of the top plate 308, the left plate 318, or the right plate 328 to further enhance the heat conductivity towards the external environment. Furthermore, in addition to fins, any other type of surface can be used to increase heat absorption, e.g., bumps.

While particular embodiments, aspects, and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. An electrical enclosure system for transferring heat from a closed environment, comprising:
   an electrical device including a heat-generating part; and
   a polymer-based ventless housing for protecting the electrical device from environmental contaminants, the ventless housing fully enclosing the electrical device and having at least three integrated molded layers, the at least three layers including
      a base layer forming an impact-resistant portion of the ventless housing, the base layer including at least two open areas in close proximity to the heat-generating part, the base layer including a first side and an opposite second side,
      a first integrated thermally conductive layer molded in a substantially parallel and overlapping manner to an internal surface of the first side of the base layer to form a water-tight union with the base layer, one of the open areas of the base layer being completely covered by the first integrated thermally conductive layer, the first integrated thermally conductive layer forming a first heat-flow path for conducting heat away from the heat-generating part towards an exterior environment, the first integrated thermally conductive layer being fixedly attached to the base layer in an immovable manner, and
      a second integrated thermally conductive layer molded in a substantially parallel and overlapping manner to an internal surface of the second side of the base layer to form a water-tight union with the base layer, another one of the open areas of the base layer being completely covered by the second integrated thermally conductive layer, the second integrated thermally conductive layer forming a second heat-flow path for conducting heat away from the heat-generating part towards the exterior environment in an opposite direction to the first heat-flow path, the second integrated thermally conductive layer being fixedly attached to the base layer in an immovable manner.

2. The electrical enclosure system of claim 1, wherein at least one of the first integrated thermally conductive layer and second integrated thermally conductive layer has an internal surface that is in direct contact with the heat-generating part.

3. The electrical enclosure system of claim 1, wherein at least one of the first integrated thermally conductive layer and second integrated thermally conductive layer has an internal surface and an external surface, at least one of the internal surface and the external surface including protrusions for increasing surface area of heat absorption and dissipation.

4. The electrical enclosure system of claim 1, wherein the ventless housing further includes one or more heat transfer aids for further increasing conductance of heat towards the exterior environment.

5. An electrical enclosure system for efficient heat dissipation, comprising:
   an electrical heat-generating device having at least one hot portion, the hot portion generating more heat than at least one other portion of the heat-generating device; and
   a ventless housing enclosing the electrical heat-generating device and including
      a first layer forming a structural portion of the ventless housing, the first layer including a first side and an opposite second side, each of the first side and second side having one or more open areas near the hot portion of the electrical heat-generating device,
      a second layer integrated in a fixedly and immovable manner with the first side of the first layer and forming a first heat-flow path of the ventless housing, the second layer being adapted to conduct more heat than the first layer from the hot portion to an environment exterior of the ventless housing, the second layer being molded in a substantially parallel and overlapping manner to an internal surface of the first side, the second layer completely covering any open areas of the first side such that heat is conducted through the second layer, and
      a third layer integrated in a fixedly and immovable manner with the second side of the first layer and forming a second heat-flow path of the ventless housing, the second heat-flow path conducting heat away from the heat-generating part towards the exterior environment in an opposite direction than the first heat-flow path, the third layer being adapted to conduct more heat than the first layer, the third layer being molded in a substantially parallel and overlapping manner to an internal surface of the second side, the third layer completely covering any open areas of the second side such that heat is conducted through the third layer.

6. The electrical enclosure system of claim 5, wherein the first layer is molded to at least one of the second layer and the third layer via an overmolding process.

7. The electrical enclosure system of claim 5, wherein each of the first layer, the second layer, and the third layer includes a polymer-based material.

8. The electrical enclosure system of claim 5, wherein at least one of the second layer and the third layer is in direct contact with the hot portion of the heat-generating device.

9. The electrical enclosure system of claim 5, wherein the first layer is a metal-based sheet and at least one of the second layer and the third layer is an internal liner.

10. The electrical enclosure system of claim 9, wherein the internal liner is polymeric.

11. The electrical enclosure system of claim 9, wherein the metal-based sheet is made via a method selected from a group consisting of one or more of stamping, laser cutting, forming, welding, piercing, or extruding.

12. The electrical enclosure system of claim 5, wherein at least one of surface of the second layer and third layer includes one or more protrusions for added surface area to increase heat absorption or heat dissipation.

13. The electrical enclosure system of claim 12, wherein the one or more protrusions include at least one protrusion selected from a group consisting of fins and bumps.

14. The electrical enclosure system of claim 5, wherein at least one of the second layer and third layer further includes a heat transfer aid selected from a group consisting of a paste and an adhesive.

15. The electrical enclosure system of claim 5, wherein the heat-generating device is a part included in an electrical device selected from a group consisting of an electrical communication hub, an electric generator, an electric meter, an electric monitor, and an electric transformer.

* * * * *